United States Patent
Sato (10) Patent No.: US 9,029,815 B2
(45) Date of Patent: May 12, 2015

(54) COLLECTOR MIRROR ASSEMBLY AND EXTREME ULTRAVIOLET LIGHT SOURCE DEVICE USING SAID COLLECTOR MIRROR ASSEMBLY

(75) Inventor: Hiroto Sato, Gotenba (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/583,471

(22) PCT Filed: Mar. 2, 2011

(86) PCT No.: PCT/JP2011/054753
§ 371 (c)(1), (2), (4) Date: Sep. 7, 2012

(87) PCT Pub. No.: WO2011/111582
PCT Pub. Date: Sep. 15, 2011

(65) Prior Publication Data
US 2012/0326058 A1 Dec. 27, 2012

(30) Foreign Application Priority Data
Mar. 11, 2010 (JP) .................................. 2010-054302

(51) Int. Cl.
G02B 5/08 (2006.01)
G03F 7/20 (2006.01)
H05G 2/00 (2006.01)

(52) U.S. Cl.
CPC ............ G03F 7/70166 (2013.01); H05G 2/001 (2013.01); G03F 7/70891 (2013.01); G03F 7/70958 (2013.01); G21K 2201/064 (2013.01)

(58) Field of Classification Search
CPC ............ G03F 7/70166; G03F 7/70891; G03F 7/70033; G02B 7/1815; H05G 2/001; H05G 2/003; H05G 2/005; H05G 2/008; G21K 1/067
USPC ....................................... 250/504 R; 359/845
See application file for complete search history.

(56) References Cited

U.S. PATENT DOCUMENTS 6,426,968 B1 * 7/2002 Strife et al. ..................... 372/99
7,256,407 B2 * 8/2007 Schuurmans et al. .... 250/504 R
(Continued)

FOREIGN PATENT DOCUMENTS

JP 2004-165638 A 6/2004
JP 2005-310922 A 11/2005
(Continued)

OTHER PUBLICATIONS

International Search Report of International Application No. PCT/JP2011/054753 Date of Mailing Apr. 19, 2011 in English and Japanese.

*Primary Examiner* — Jack Berman
*Assistant Examiner* — Wyatt Stoffa
(74) *Attorney, Agent, or Firm* — Roberts Mlotkowski; Safran & Cole, P.C.; David S. Safran (57) ABSTRACT

A deterioration of the collector performance in an extreme ultraviolet light source device due to a heat deformation of the collector mirror assembly is to be prevented. The collector mirror assembly used in the extreme ultraviolet light source device comprises a plurality of reflective shells 21 with different diameters which are shaped as ellipsoids of revolution or hyperboloids of revolution, wherein the reflective shells 21 are arranged in a nested shape and the ends thereof are held by a holding structure 22. A cooling channel, through which a cooling medium flows is mounted at the reflective shell 21 in the axial direction of the reflective shell on the face being the back side of the reflective surface. This cooling channel acts as a reinforcement material and is able to suppress a heat deformation of the reflective shell 21. By using molybdenum as the material for the reflective shells 21, the heat deformation can be suppressed even further, and by providing cooling channels in the holding structure 22, the collector mirror assembly can be cooled even more efficiently and a heat deformation thereof can be suppressed.

3 Claims, 10 Drawing Sheets

(56) References Cited

U.S. PATENT DOCUMENTS

| | | | |
|---|---|---|---|
| 8,153,994 B2 * | 4/2012 | Pedrali et al. | 250/492.1 |
| 8,342,701 B2 * | 1/2013 | Kierey et al. | 359/845 |
| 8,425,060 B2 * | 4/2013 | Watson et al. | 359/846 |
| 8,746,975 B2 * | 6/2014 | Bianucci et al. | 378/85 |
| 2003/0150737 A1 * | 8/2003 | Van Delft et al. | 205/118 |
| 2007/0023711 A1 * | 2/2007 | Fomenkov et al. | 250/504 R |
| 2007/0084461 A1 * | 4/2007 | Box et al. | 126/625 |
| 2007/0114470 A1 * | 5/2007 | Bowering | 250/504 R |
| 2008/0017801 A1 * | 1/2008 | Fomenkov et al. | 250/354.1 |
| 2008/0018876 A1 * | 1/2008 | Stuetzle et al. | 355/67 |
| 2008/0048134 A1 * | 2/2008 | Shirai et al. | 250/504 R |
| 2009/0101850 A1 * | 4/2009 | Korobochko et al. | 250/504 R |
| 2009/0122428 A1 * | 5/2009 | Phillips et al. | 359/846 |
| 2009/0122429 A1 * | 5/2009 | Watson et al. | 359/846 |
| 2010/0096557 A1 * | 4/2010 | Zocchi et al. | 250/370.09 |
| 2010/0303199 A1 * | 12/2010 | Wallhead et al. | 378/34 |
| 2011/0051267 A1 * | 3/2011 | Kierey et al. | 359/845 |
| 2011/0128513 A1 * | 6/2011 | Pedrali et al. | 355/30 |
| 2011/0192995 A1 * | 8/2011 | Ershov et al. | 250/504 R |
| 2011/0205506 A1 * | 8/2011 | Bianucci et al. | 355/30 |
| 2011/0216395 A1 * | 9/2011 | Pirovano et al. | 359/350 |
| 2012/0147349 A1 * | 6/2012 | Van Dijsseldonk et al. | 250/504 R |

FOREIGN PATENT DOCUMENTS

| | | |
|---|---|---|
| JP | 2007-285909 A | 11/2007 |
| WO | 2009/095220 A2 | 8/2009 |

* cited by examiner

before the heat deformation (b)

example according to the
state of the art after the
heat deformation (c)

embodiment 2 (generatrix
direction + Mo) after the
heat deformation

Fig. 6

Fig. 7 comparison of collecting ratios
(ratio with regard to the output at
the point of the light emission)

(a) outside shape after heat deformation outside shape before heat deformation example according to the state of the art (b)

embodiment 1

COLLECTOR MIRROR ASSEMBLY AND EXTREME ULTRAVIOLET LIGHT SOURCE DEVICE USING SAID COLLECTOR MIRROR ASSEMBLY

TECHNICAL FIELD

The present invention relates to a collector mirror assembly collecting extreme ultraviolet radiation emitted from high temperature plasma, and an extreme ultraviolet light source device using said collector mirror assembly, and relates specifically to a cooling channel structure of the collector mirror assembly.

BACKGROUND ART

With the miniaturization and the high degree of integration of semiconductor integrated circuits, there is the demand to increase the resolution in the projection exposure device for the manufacture thereof. To meet this demand, a shortening of the wavelength of the light source for the exposure is promoted, and extreme ultraviolet light source devices (in the following also referred to as EUV light source devices') emitting extreme ultraviolet radiation (in the following also referred to as 'EUV (extreme ultra violet') with a wavelength of 13 to 14 nm and in particular 13.5 nm are developed as light sources for the exposure of next generation semiconductors.

Several methods for the generation of EUV radiation in EUV light source devices are known, and one method among these is to generate a high temperature plasma by heating and exciting an EUV radiation seed and to extract the EUV radiation which is emitted from this plasma.

One of the types of EUV light source devices employing such a method is the DPP (discharge produced plasma)-type EUV light source device. The DPP-type EUV light source device utilizes the EUV radiation from high temperature plasma generated by a current drive.

In EUV light source devices, Li (lithium) and Sn (tin) have drawn attention as the radiation seed, that is, the high temperature plasma raw material for the EUV generation, to emit EUV radiation with a wavelength of 13.5 nm at a high radiation intensity.

In the following, the mechanism of the EUV radiation on the basis of the DPP method will be explained briefly.

In the DPP method, for example a gaseous high temperature plasma raw material atmosphere is provided in the interior of a discharge vessel wherein electrodes are arranged, a discharge is generated between the electrodes in said atmosphere and an initial plasma is generated. Said initial plasma is constricted by means of the self magnetic field of the direct current flowing between the electrodes because of the discharge. Thus the density of the initial plasma becomes high and the plasma temperature increases abruptly. This effect is referred to in the following as pinch effect. By means of the heating because of the pinch effect the ion density of the plasma having reached a high temperature reaches $10^{17}$ to $10^{20}$ cm$^{-3}$, and the electron temperature reaches about 20 to 30 eV, and EUV radiation is emitted from this high temperature plasma.

Recently, a method wherein solid or liquid tin or lithium having been provided to the surfaces of the discharge generating electrodes is gasified by an irradiation with an energy beam such as a laser and afterwards a high temperature plasma is generated by a discharge has been suggested for the DPP method in patent literature example 1. In the following, a case in which the energy beam is a laser will be explained. This method described below will be referred to as LAGDPP (laser assisted gas discharge produced plasma) method.

In the following, an LAGDPP-type EUV light source device will be explained using FIG. 11.

Figure 11:
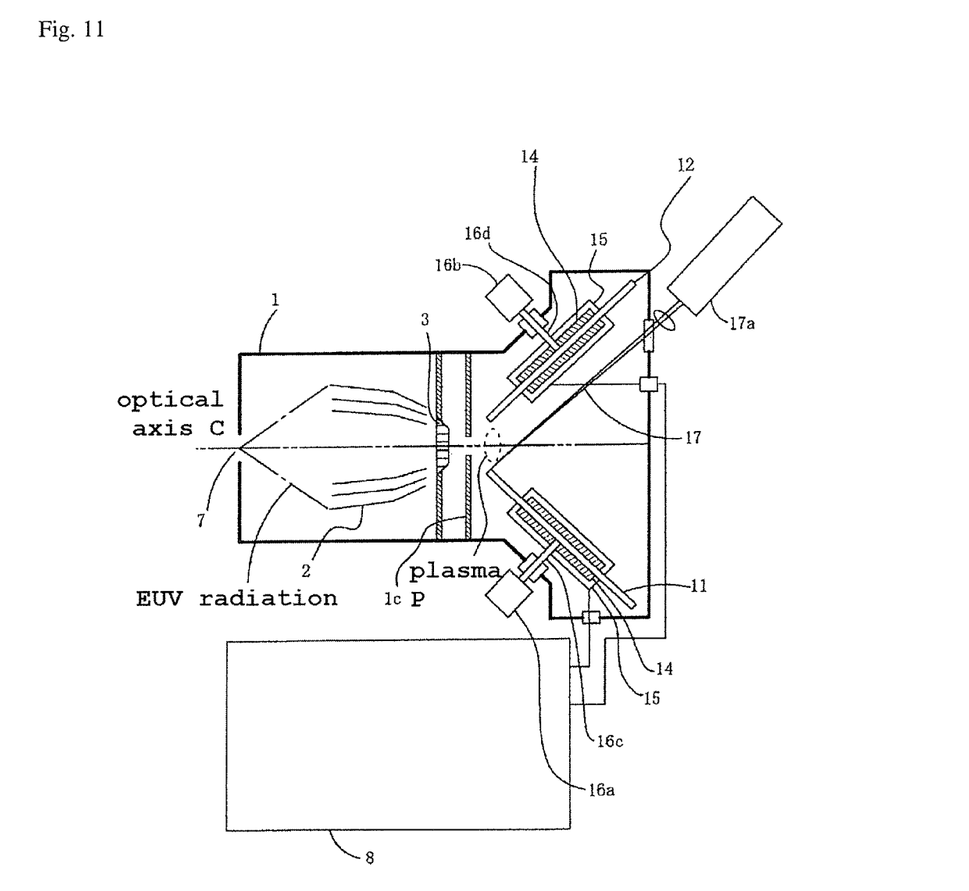
FIG. 11 is a view showing a configurational example of an EUV light source device according to the LAGDPP method.

The EUV light source device shown in FIG. 11 has a chamber 1 being the discharge vessel. This chamber 1 is divided largely into two spaces by a partition wall 1c having an opening. In one of the spaces a discharge part is arranged. The discharge part is a heating and exciting means to heat and excite a high temperature plasma raw material containing an EUV radiation seed. The discharge part comprises a pair of electrodes 11, 12.

In the other space an EUV collecting mirror 2 to collect EUV radiation emitted from the high temperature plasma having been generated by heating and exciting the high temperature plasma raw material and to direct it from an EUV radiation extraction part 7 provided at the chamber 1 to an irradiation optical system of the exposure device not illustrated in the drawing, and a debris trap 3 to suppress a transfer of debris occurring as a result of the plasma generation by means of a discharge to the EUV radiation collection part are arranged.

The reference numerals 11 and 12 refer to disc-shaped electrodes. These electrodes 11, 12 are separated by a specified distance and rotate around a rotating shaft 16c, 16c by rotating a rotation motor 16a, 16b respectively.

The reference numeral 14 refers to a high temperature plasma raw material emitting EUV radiation with a wavelength of 13.5 nm. This high temperature plasma raw material 14 is a heated melted metal such as, for example, liquid tin, which is accommodated in a container 15.

The electrodes 11, 12 are arranged such that a part thereof is immersed in the container 15 accommodating the high temperature plasma raw material 14. The liquid high temperature plasma raw material 14 having got onto the surface of the electrodes 11, 12 is transported into the discharge space by means of rotating the electrodes 11, 12. Laser light 17 from a laser source 17a is radiated to the high temperature plasma raw material 14 having been transported into the discharge space. This laser light 17 gasifies the irradiated high temperature plasma raw material 17. By applying a pulsed current from a current supply means 8 to the electrodes 11, 12 in this state, in which the high temperature plasma raw material 14 has been gasified by the irradiation with the laser light 17, a pulsed discharge is started between the electrodes 11, 12 and a plasma P is formed from the high temperature plasma raw material 14. When this plasma P is heated and excited by the large current flowing at the time of the discharge and reaches a high temperature, an EUV emission from this high temperature plasma is generated.

The EUV radiation emitted from the high temperature plasma P is collected by the EUV collector mirror 2 and is extracted from the EUV extraction part 7 to an exposure device not illustrated in the drawing.

Thus, the extreme ultraviolet radiation emitted from the high temperature plasma being the point of the light emission is collected by the collector mirror 2 and the extreme ultraviolet radiation is outputted from the opening (EUV extraction part) 7. Now, the collector mirror 2 comprises reflective shells reflecting the extreme ultraviolet radiation emitted from the high temperature plasma and a reflective shell holding structure holding these reflective shells in the light source device. In the following, this configuration will be referred to as collector mirror assembly 20.

As to the collector mirror assembly, a grazing incidence collector mirror assembly is known wherein a plurality of reflective shells with different diameters, which are shaped as ellipsoids of revolution or hyperboloids of revolution and which are overlying a rotational central axis such that the positions of the collecting point approximately coincide, are arranged in a nested fashion and are held by a holding structure. The reflective shells are elements for which a reflective layer reflecting extreme ultraviolet radiation is provided at the surface of one side of a base material. In consideration of the mechanical strength and the thermal conductivity a metal material is selected as the material for the base material of the reflective shells.

In patent literature example 1, nickel, aluminium, copper, and nickel-cobalt alloys are cited as preferred materials for the material of the collector mirror. Then, a material by means of which a high reflectivity with regard to extreme ultraviolet radiation, typically extreme ultraviolet radiation with a wavelength of 13.5 nm, is obtained, is selected for the reflective layer. In patent literature example 1, palladium, indium, platinum, molybdenum, rhodium and ruthenium are cited as preferred materials for the reflective layer.

The light generated from the high temperature plasma and high velocity ions etc. enter the collector mirror assembly, and a portion thereof is absorbed and becomes a thermal load. Therefore, the temperature of each portion of the collector mirror assembly rises during the lighting operation.

With this temperature rise the reflective shells making up the collector mirror assembly are deformed by heat and deviate from the ideal shape of the reflective surface. And with the temperature rise there is also a heat deformation of the reflective shell holding structure and the positional relation between each reflective shell and the point of the light emission deviates from the ideal condition. As a result the collector performance deteriorates, and in case of a significant temperature rise the deterioration of the reflective film by means of, e.g., an oxidation is promoted, the reflectivity of the extreme ultraviolet radiation decreases and the collector performance worsens.

In an exposure device using extreme ultraviolet radiation, the light source device and the exposure device main body are divided by a small opening (aperture, the EUV extraction part 7 in FIG. 11). The reasons for the provision of the aperture are the provision of a spatial separation to avoid a mutual interference of the vacuum states of the light source side chamber and the exposure device main body side chamber and the cut-off of unnecessary light which actually does not contribute to the exposure. Generally, the aperture is provided at a position at which the spatial distribution of the emission light from the collector mirror assembly is narrowest (the collecting point).

When the collector performance of the collector mirror assembly deteriorates, the spatial intensity distribution of the light at the position of the collecting point becomes broad, because of which even light which should actually pass is blocked by the aperture and, potentially, the power necessary for the exposure may not be obtained any longer. Then, the deterioration of the collector performance impairs the angular distribution of the light after the passage through the aperture which becomes a factor for the decrease of the exposure quality. Thus, the deterioration of the collector performance brings about a decrease of the performance as a light source device such as a reduction of the light source output or a reduction of the homogeneity of the distribution of the light intensity.

To suppress the temperature increase of the collector mirror assembly becoming the reason for the deterioration of the collector performance, a cooling channel for cooling the reflective shell is provided. In patent literature 2, for example, a collector mirror assembly is shown wherein a flow channel through which a fluid passes is provided at the non-reflective surface of the reflective shell and heat is removed by a flow of a cooling fluid such as water.

LITERATURE REGARDING THE PRIOR ART

Patent Literature Examples

Patent literature example 1: WO 2009/095220 A2
Patent literature example 2: Japanese Patent No. 4105616

DISCLOSURE OF THE INVENTION

Problems to be Solved by the Invention

When the reflective shell is cooled by using a cooling channel, the temperature rise of the collector mirror assembly is suppressed to a certain extent, but cannot be suppressed completely. In particular, a temperature rise in portions of the collector mirror where no cooling channel is provided cannot be avoided. In the collector mirror assembly according to the state of the art the collector performance deteriorates because of a heat deformation of the collector mirror assembly in conjunction with the temperature rise. As a result, the performance as a light source device decreases. Especially in high output light source devices the thermal load of the collector mirror assembly becomes high and the decrease of the collector performance because of the heat deformation becomes even more significantly.

The present invention was made to solve the above-mentioned problems, and the object thereof is to prevent a deterioration of the collector performance because of a heat deformation of the collector mirror assembly.

Means for Solving the Problems

In the present invention, the cooling channel through which a cooling medium for cooling the reflective shell passes is mounted on the face being the back side of the reflective surface of the reflective shell of the collector mirror surface and in the axial direction of the reflective shell. In the following, the axial direction of the reflective shell on the surface of the reflective shell will also be referred to as the 'generatrix direction'.

Preferably, molybdenum is used as the material for the base material of the reflective shell, and by means of providing cooling channels in the holding structure holding said reflective shells, the collector mirror assembly can be cooled even more efficiently.

That is, the above-mentioned problems are solved by the present invention in the following ways.

(1) In a collector mirror assembly comprising a plurality of grazing incidence reflective shells with different diameters which are shaped as ellipsoids of revolution or hyperboloids of revolution and which are overlying a rotational central axis such that the positions of the collecting points approximately coincide, and a reflective shell holding structure holding said plurality of reflective shells, a cooling channel through which a cooling medium cooling the reflective shell passes is formed in the reflective shell along the generatrix direction of the reflective shell.

(2) In the above-mentioned point (1) the reflective shells are elements for which one surface of a base material is provided with a reflective layer reflecting extreme ultraviolet radiation, and molybdenum is employed as the material for the base material.

(3) In the above-mentioned points (1) and (2) cooling channels through which a cooling medium cooling said holding structure passes are formed in the reflective shell holding structure.

(4) The collector mirror assembly of the above-mentioned points (1), (2) and (3) is used for the collector means of an extreme ultraviolet light source device being provided with a discharge part comprising a pair of discharge electrodes heating and exciting an extreme ultraviolet radiation seed and generating a high temperature plasma, a collector means collecting extreme ultraviolet radiation emitted from the high temperature plasma having been generated in the discharge part, and a light extraction part which outputs the collected extreme ultraviolet radiation.

Results of the Invention

By means of the present invention, the following results can be obtained.

(1) Because the cooling channel running in the generatrix direction of the base material acts as a reinforcement material, a heat distortion of the reflective shell in the generatrix direction and in the perpendicular direction can be suppressed even if the temperature of the reflective shell rises because of a thermal load.

Therefore, a decrease of the collector performance is suppressed.

(2) By means of employing molybdenum as the material for the reflective shell base material, the amount of the heat deformation of the reflective shell can be reduced and a decrease of the collector performance is suppressed.

(3) As, by means of cooling the reflective shell holding structure, a temperature rise can be suppressed, the amount of the heat deformation of the reflective shell holding structure becomes low. Thus, the positional relation between each reflective shell and the point of the light emission does not deviate from the ideal position, and therefore a decrease of the collector performance can be suppressed even further.

MODES FOR THE IMPLEMENTATION OF THE INVENTION

Figure 1:
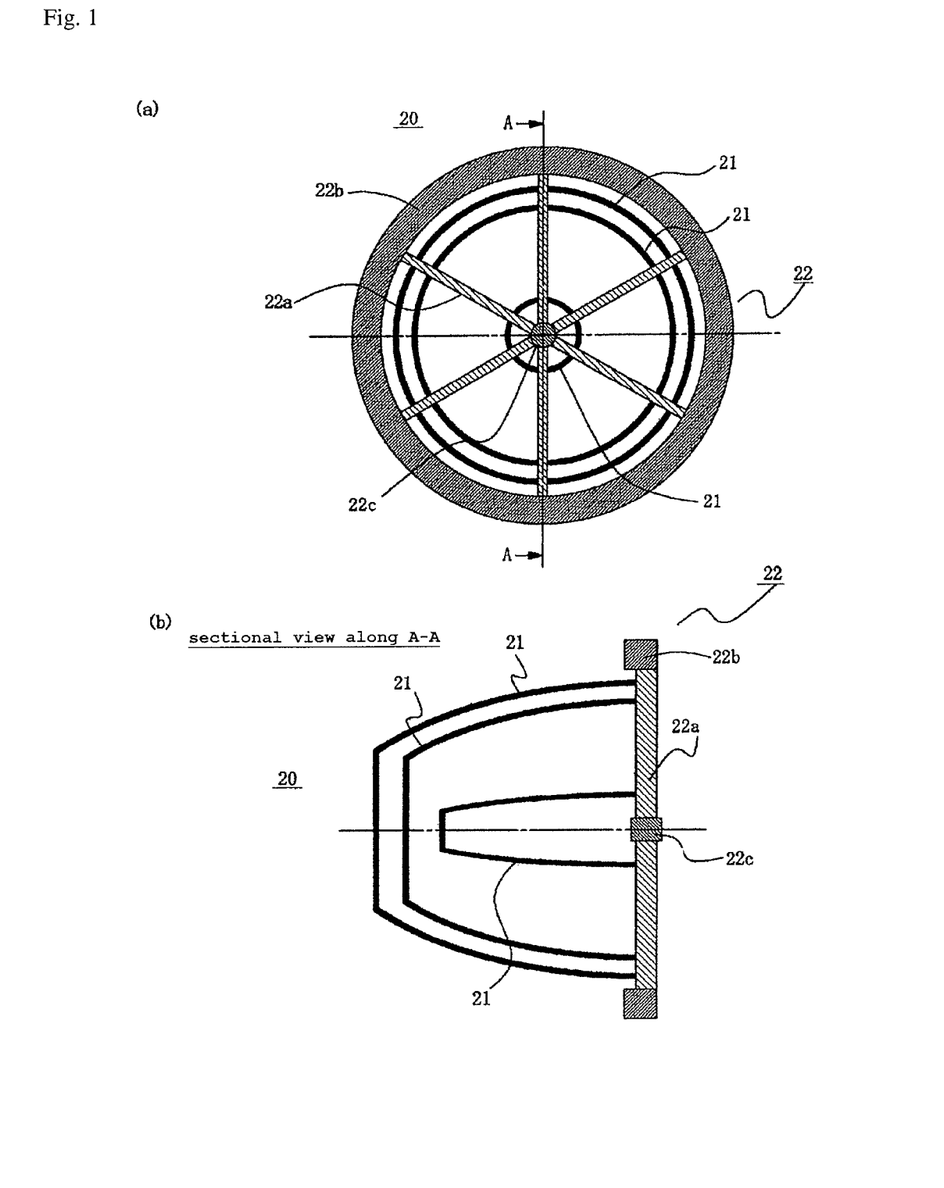
FIG. 1 is a schematical view showing the configuration of a collector mirror assembly.

The configuration of a collector mirror assembly 20 is shown in FIG. 1, wherein (a) is a view of the collector mirror assembly from the side of the holding structure and (b) is a sectional view along the plane passing through the axis of the collector mirror assembly (a sectional view along A-A in (a)). In FIG. 1(b), EUV radiation radiated from the left side of the paper face is collected and emitted from the right side of the paper face.

As is shown in FIG. 1, the collector mirror assembly 20 comprises a plurality of a first to an n-th reflective shell 21 and a holding structure 22.

The collector mirror assembly 20 has a plurality of reflective shells 21 with different diameters which are shaped as ellipsoids of revolution or hyperboloids of revolution and which are overlying a rotational central axis such that the positions of the collecting point approximately coincide on the same axis, and these reflective shells 21 are arranged in a nested fashion.

The reflective shells 21 are elements for which a reflective layer reflecting extreme ultraviolet radiation is provided at one surface (the light incidence face) of a base material, and in the present embodiment, a reflective layer made from ruthenium is provided as the reflective layer. To obtain a high reflectivity with regard to extreme ultraviolet radiation, the surface of this reflective layer is extremely smooth, and the square average surface roughness is adjusted to, for example, at most 2 nm.

Each reflective shell 21 is fixed at an end thereof to a holding plate 22a of the holding structure 22, and the holding plate 22a is fixed to an annular outer holding structure 22b and inner holding structure 22c at the outside and at the inside, respectively. In the following, the holding plates 22a and the annular structures 22b, 22c fixing the holding plate are jointly referred to as 'reflective shell holding structure 22' or, simply, as 'holding structure 22'.

Now, FIG. 1 illustrates the configuration of the whole collector mirror assembly 20 schematically, but does not show the cooling channels of the reflective shells 21; and moreover, only a part of the reflective shells 21 is shown.

Figure 2:
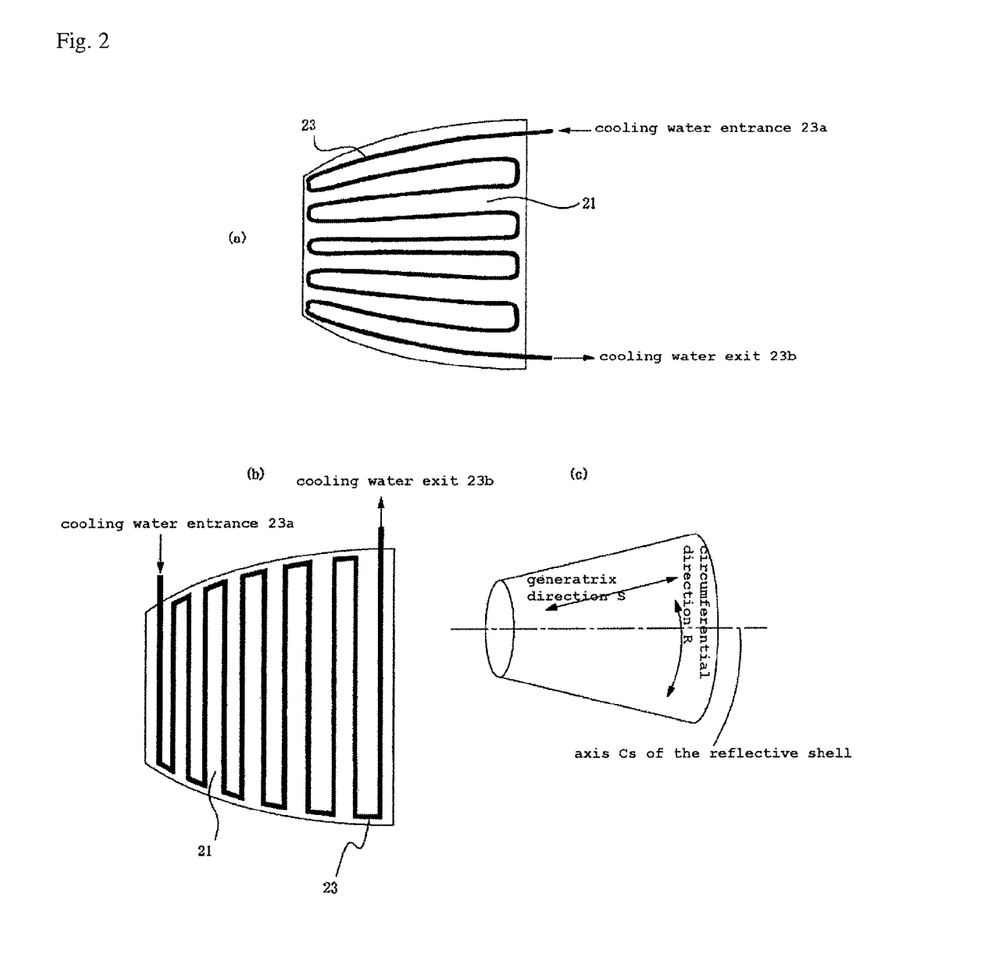
FIG. 2 is a schematical view showing an example of a cooling channel structure provided at a reflective shell.

FIG. 2 shows an example of the configuration of the cooling channel provided in the reflective shell schematically, wherein (a) and (b) respectively are schematical representations of the arrangement of the cooling channel 23 of a reflective shell according to the present invention and of the cooling channel 23 of a reflective shell according to the state of the art.

As is shown in FIG. 2(a), the cooling channel 22 of the embodiment of the present invention having a cooling water entrance 23a and a cooling water exit 23b is formed in the generatrix direction of the reflective shell. In the collector mirror assembly of the example according to the state of the art, on the other hand, the cooling channel 23 is formed in the circumferential direction of the reflective shell 21, as is shown in FIG. 2(b).

Then, as is shown in FIG. 2(c), in the present embodiment the direction of the axis Cs (the rotational axis of the reflective shell being shaped as ellipsoid of revolution or hyperboloid of revolution) running on the face of the reflective shell as mentioned above is referred to as generatrix direction S, while the direction crossing said axis on the face of the reflective shell is referred to as circumferential direction R.

Figure 3:
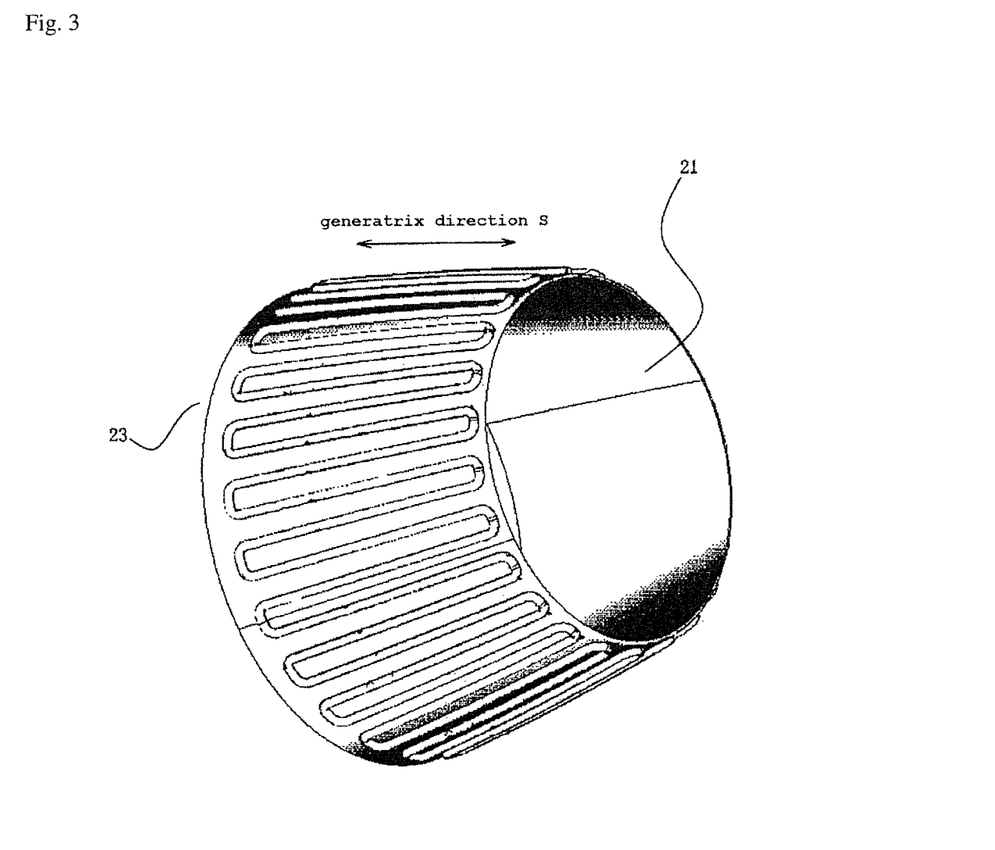
FIG. 3 is a view showing a concrete configurational example of a reflective shell being provided with a cooling channel according to an embodiment of the present invention.

FIG. 3 shows a concrete configurational example of a reflective shell wherein a cooling channel is provided.

In this drawing, one reflective shell 21 is shown. The reflective face is formed on the inner surface of the reflective shell which is shaped as ellipsoid of revolution or hyperboloid of revolution, while the cooling channel 23 is provided on the outer surface being the back face in the generatrix direction. This cooling channel is an element for which a tube-shaped element formed from, for example, the same material as the material of the reflective shell is mounted on the back face of the reflective shell 21. In this element, a cooling medium supplied from a source of supply (not shown) flows and cools the reflective element 21.

As to the base material of said reflective shell, for example nickel (Ni) can be used, but by using molybdenum (Mo) the heat deformation can be rendered smaller as compared to a utilization of nickel.

In the following, a reflective shell wherein the cooling channel has been provided in the generatrix direction of the reflective shell (the material for the base material is not of concern, but for example nickel has been used) is referred to as embodiment 1 while a reflective shell wherein the cooling channel has been provided in the generatrix direction of the reflective shell and molybdenum has been used as the material for the base material, is referred to as embodiment 2.

Figure 4:
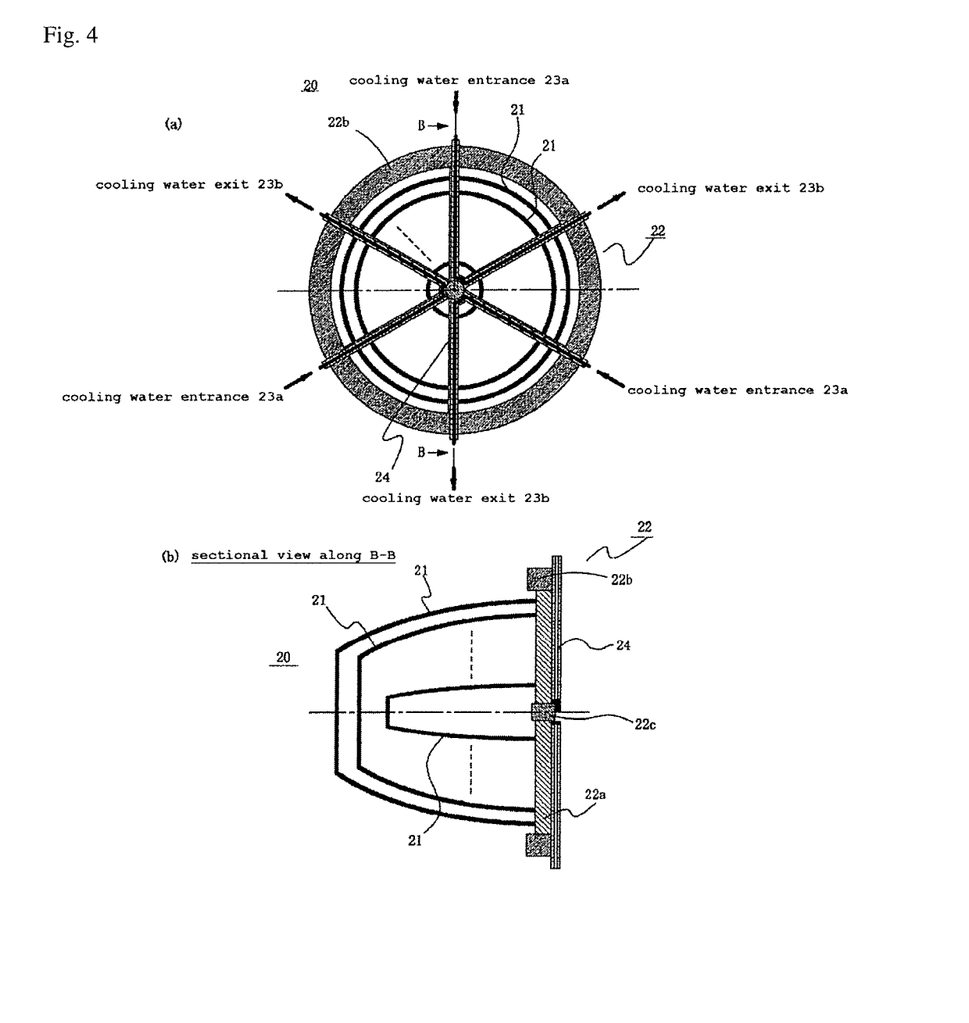
FIG. 4 is a schematical view showing the configuration of the collector mirror assembly according to embodiment 3 of the present invention.

FIG. 4 is a view showing the configuration of the collector mirror assembly according to embodiment 3 of the present invention, wherein (a) is a view of the collector mirror assembly from the side of the holding structure and (b) is a sectional view along the plane passing through the axis of the collector mirror assembly (a sectional view along B-B in (a)).

As is shown in FIG. 4, the collector mirror assembly 20 comprises a plurality of a first to an n-th reflective shell 21 and a holding structure 22.

As to the reflective shell 21, a plurality of reflective shells 21 having different diameters and being shaped as ellipsoid of revolution or hyperboloid of revolution are arranged in a nested fashion as was mentioned above. At each reflective shell a cooling channel is provided in the generatrix direction such as shown in FIG. 3.

These reflective shells 21 are fixed at an end thereof to a holding plate 22a of the holding structure 22, and the holding plate 22a is fixed to an annular outer holding structure 22b and inner holding structure 22c at the outside and inside, respectively.

As is shown in FIG. 4, holding plate cooling channels 24 are provided in said holding structure 22. The holding plate cooling channels 24 are arranged along the holding plates 22a of the holding structure 22. As is shown in FIG. 4(b), a cooling medium such as cooling water flows in at an entrance 23a provided at one side of the holding plate cooling channel 24, flows out from an exit 23b at the other side, and cools the holding structure 22.

By means of performing a cooling by providing cooling channels 24 along the holding plates 22a of the holding structure 22 for the reflective shells 21 in addition to the arrangement of arranging cooling channels along the generatrix direction of the reflective shells 21, a temperature rise can be suppressed and the amount of the heat deformation of the holding plates 22a can be reduced.

In the collector mirror assembly with the above-mentioned configuration, it is possible to use, for example, nickel (Ni) as the base material of the reflective shells 21 etc., but by using molybdenum (Mo) the heat deformation can be rendered smaller as compared to a utilization of nickel.

In the following, the collector mirror assembly with the above-mentioned configuration (the material for the base material is not of concern, but for example nickel has been used) is referred to as embodiment 3, while an utilization of molybdenum as the material for the base material in the above-mentioned configuration is referred to as embodiment 4.

To summarize the above-mentioned descriptions, the example according to the state of the art and the embodiments of the present invention are implemented such as shown in table 1. In the example according to the state of the art and in the embodiments 1 and 3 the material for the base material of the reflective shells is not limited to nickel, but the verifications described below were performed with a utilization of nickel (Ni).

TABLE 1

|  | channel direction | material | cooling of holding plates |
|---|---|---|---|
| state of the art | circumferential | Ni | no |
| embodiment 1 | generatrix | Ni | no |
| embodiment 2 | generatrix | Mo | no |
| embodiment 3 | generatrix | Ni | yes |
| embodiment 4 | generatrix | Mo | yes |

The collector mirror assemblies of the above-mentioned embodiments 1 to 4 can be used as the collector means in a LAGDPP-type EUV light source device such as shown in FIG. 11, which is provided with a discharge part comprising a pair of electrodes heating and exciting an extreme ultraviolet radiation seed such as, for example, lithium (Li) or tin (Sn) and generating a high temperature plasma; a collection part collecting the extreme ultraviolet radiation emitted from the high temperature plasma having been generated in the discharge part; and an extraction part outputting the collected extreme ultraviolet radiation, or in the above-mentioned DPP-type EUV light source device. By means of utilizing the collector mirror assembly of the present invention it is possible to obtain an EUV light source device wherein a decrease of the collector performance with regard to a temperature rise of the collector mirror assembly is suppressed.

To verify the results of the present invention, the temperature distribution and the amount of the heat deformation when applying a thermal load to each part of the collector mirror assembly were determined by means of a finite-element analysis for the example according to the state of the art and the embodiments 1 to 4, and the collector performance for the collector mirror assemblies after the heat deformation was calculated by using the ray tracing method. Then, the extent of the change of the collector performance between before and after the heat deformation was compared and verified for the present invention and the example according to the state of the art. The detailed procedures were as follows.

(a) The ray tracing method is used for the collector mirror assemblies before the heat deformation and the collector performance is calculated by means of a simulation. Here, the number of the reflective shells of the collector mirror assemblies was set to 9, the shape of the plasma being the point of the light emission was assumed to be an axis-symmetric Gaussian shape with a diameter of 1 mm and a length of 1.3 mm, and the irradiance distribution was assumed to be isotropic. By means of the simulation of the collection also the power being absorbed at each part of the collector mirror assembly is obtained together with the collector characteristics such as the irradiance distribution at the face containing the collecting point and the angular distribution of the radiation at the collecting point, and therefore the thermal load to each part can be calculated.

Table 2 shows the thermal load to each part of the collector mirror assembly (the power absorbed at each part of the collector mirror assembly) calculated from the results of the simulation of the collection. Now, the radiation power radiated from the point of the light emission into a space with a solid angle of 2 π was set to 11 kW while the non-radiation power emitted as kinetic energy of high velocity ions and the like was set to 5.3 kW.

TABLE 2

|  | absorption power of radiation (W) | absorption power of non-radiation (W) | total absorption power (W) |
|---|---|---|---|
| shell no. 1 | 428 | 368 | 856 |
| shell no. 2 | 421 | 324 | 745 |
| shell no. 3 | 368 | 294 | 662 |
| shell no. 4 | 311 | 272 | 583 |
| shell no. 5 | 280 | 249 | 529 |
| shell no. 6 | 933 | 667 | 1600 |
| shell no. 7 | 372 | 457 | 829 |
| shell no. 8 | 180 | 261 | 441 |
| shell no. 9 | 86 | 134 | 220 |
| holding element | 92 | 4 | 96 |
| total | 3530 | 3030 | 6560 |

(b) The temperature change of each part of the collector mirror assembly, to which the thermal load having been calculated in procedure (a) has been applied, is determined by means of the finite element method.

(c) The amount of the heat deformation of each part of the collector mirror assembly according to the temperature change having been determined by procedure (b) is determined by means of a structural analysis using the finite element method.

(d) A simulation of the collection in the same way as in procedure (a) is performed for the collector mirror assembly after the heat deformation determined in procedure (c), and the collector performance is calculated.

(e) The collector performance obtained by procedure (a) and the collector performance after the heat deformation obtained by procedure (d) are compared and the degree of the change of the collector performance because of the heat deformation is evaluated.

The shape and the conditions of the thermal load of the reflective shells were rendered uniformly for the five cases of the example according to the state of the art and the embodiments 1 to 4 shown in table 1, and the collector performances after a heat deformation according to the above-mentioned procedures were simulated and compared.

Figure 5:
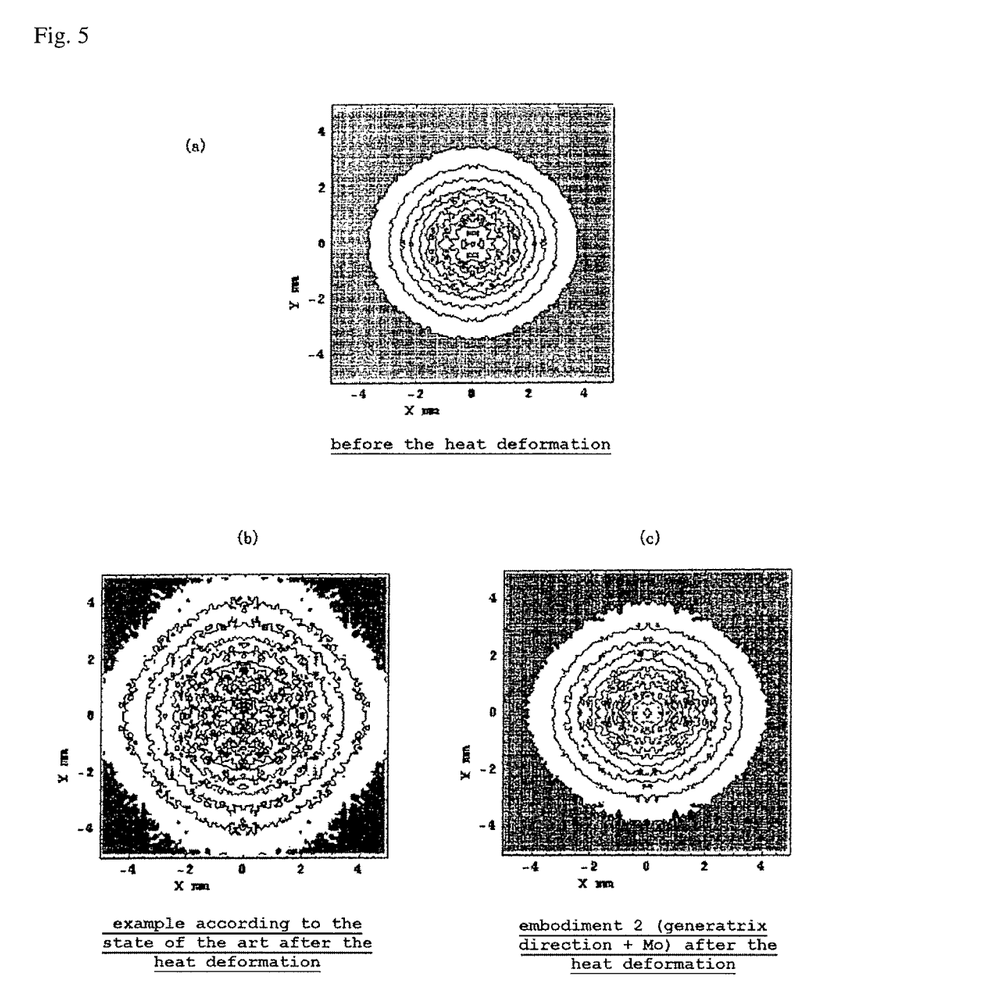
FIG. 5 is a view showing the irradiance before a heat deformation, after the heat deformation of an example according to the state of the art and after the heat deformation of embodiment 2 of the present invention.

FIG. 5 shows a comparison of the irradiance distributions in the plane containing the collecting point obtained by simulations of the collection for the conditions before the heat deformation (FIG. 5(a)), and after the heat deformation (FIG. 5(b)) for the example according to the state of the art, and after the heat deformation (FIG. 5(c)) for embodiment 2 (cooling channel provided in the generatrix direction, utilization of molybdenum for the material of the base material). FIG. 5 shows the intensity of the irradiance distributions by contour lines wherein the irradiance distributions becomes larger with the approach to the center.

Figure 6:
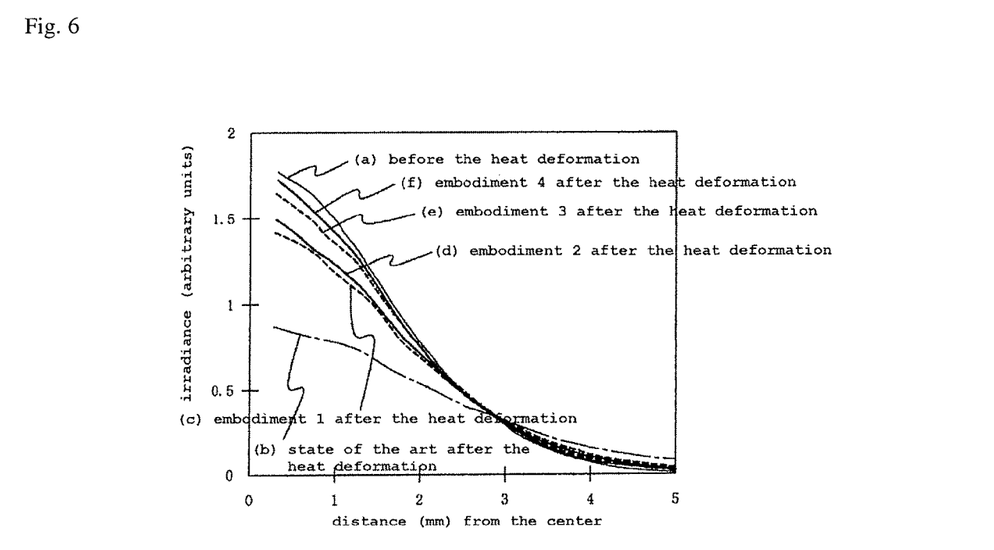
FIG. 6 is a view showing the irradiance profiles in the radial direction of an example according to the state of the art and of the embodiments 1 to 4.

Then, FIG. 6 shows a comparison of the irradiance profiles (the change of the irradiance with regard to a position) in the radial direction for the example according to the state of the art and the embodiments 1 to 4 of the present invention. In FIG. 6 the irradiances corresponding to the distance (mm) from the center are shown as graphs.

It is understood from FIG. 5 that after the heat deformation of the example according to the state of the art the fade of the image of the collecting point becomes large because of the heat deformation of the collector mirror assembly and the irradiance distribution slopes smoothly, while for the embodiments of the present invention the change in the irradiance distribution after the heat deformation is small as compared to the example according to the state of the art.

Then, it is understood from FIG. 6 that in the embodiments 1 to 4 of the present invention the change of the irradiance profiles between before and after the heat deformation is small as compared to that before and after the heat deformation of the example according to the state of the art.

Figure 7:
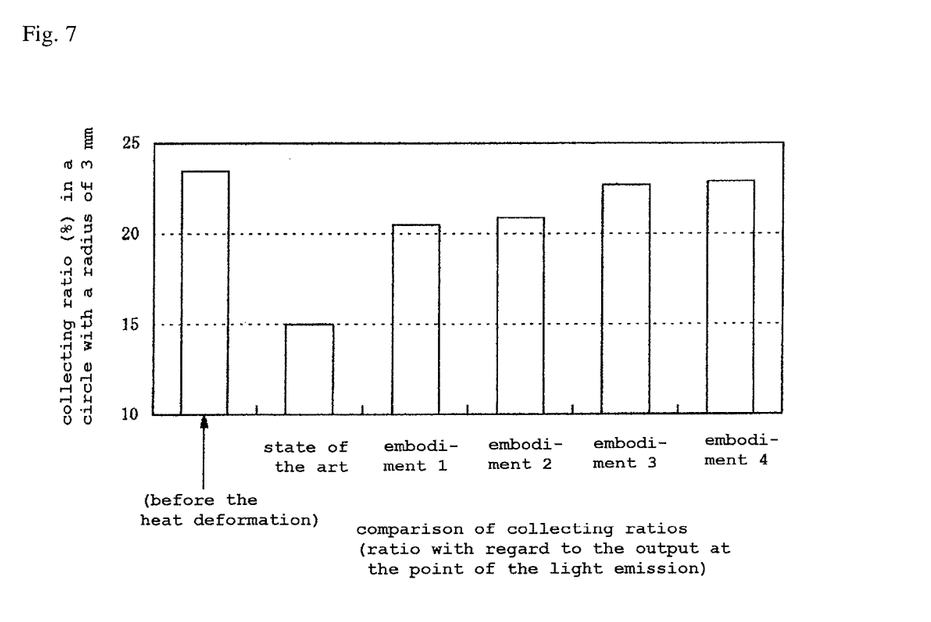
FIG. 7 is a view showing a comparison of the collecting ratios of an example according to the state of the art and of the embodiments 1 to 4.

FIG. 7 is a graph showing a comparison of the collecting ratios of the example according to the state of the art and the embodiments 1 to 4 of the present invention. Here, the collecting radio is defined as the ratio of the power of the extreme ultraviolet radiation entering a circle with a radius of 3 mm at the collecting point with regard to the power of the extreme ultraviolet radiation radiated into a space with a solid angle of 2 π from the point of the light emission.

It is understood from FIG. 7 that in the example according to the state of the art the collecting ratio decreases significantly because of the heat deformation, while in the embodiments 1 to 4 of the present invention the decrease of the collecting ratio is low. That is, when a heat deformation of the collector mirror assembly occurs in conjunction with the operation of the light source in a light source device being provided with a collector mirror assembly according to the example of the state of the art, the power of the extreme ultraviolet radiation which can be outputted from the aperture to the exterior decreases significantly, while there is almost no decrease in a light source device being provided with a collector mirror assembly according to the present invention.

Figure 8:
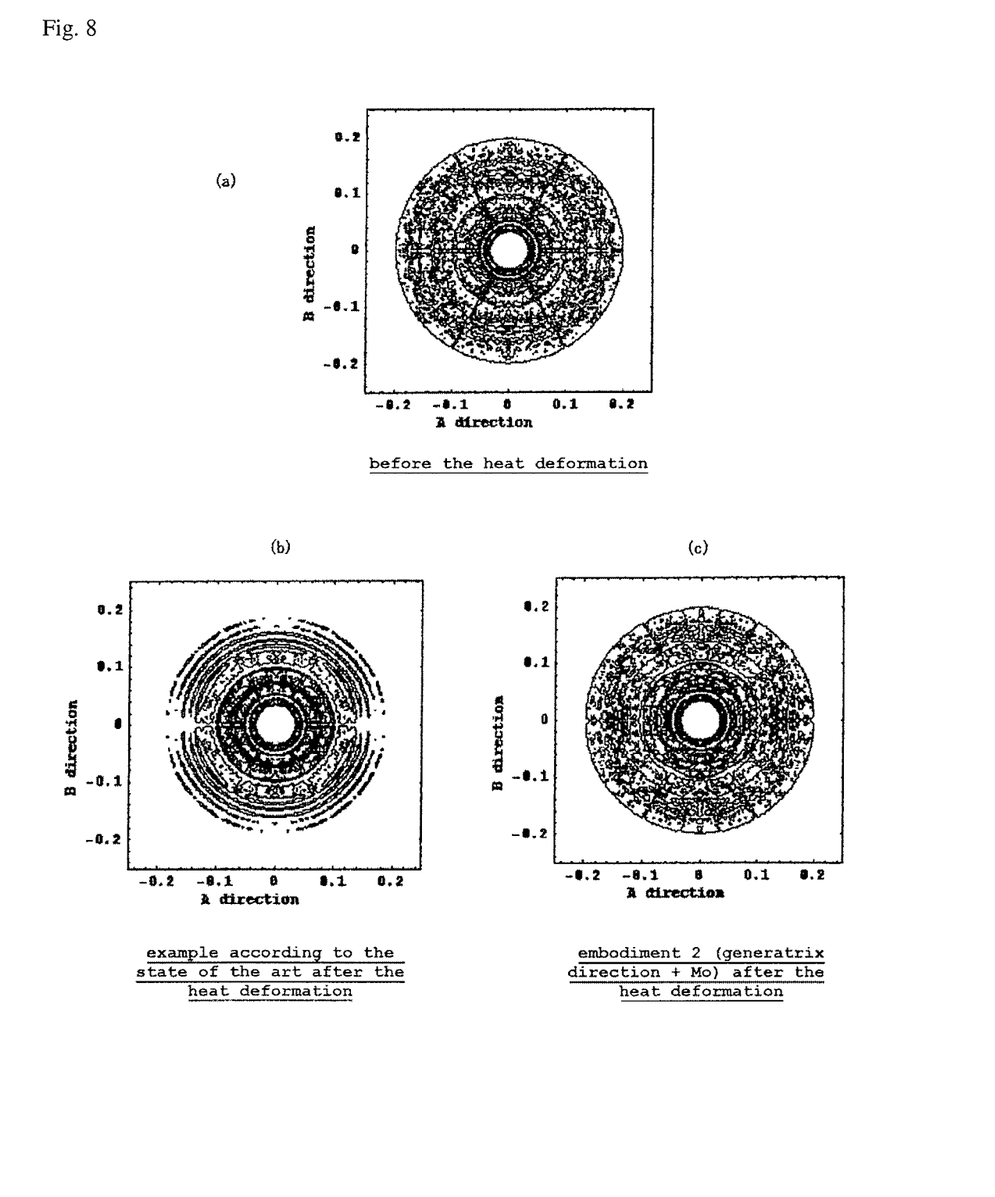
FIG. 8 is a view showing the extreme ultraviolet radiation far-field patterns after the passage of the aperture being arranged at the collecting point.

FIG. 8 shows a comparison of the extreme ultraviolet radiation far-field patterns after the passage through the aperture being provided at the collecting point obtained by the simulations of the collection. In this drawing, the far-field patterns are shown by contour lines; and the far-field patterns before the heat deformation (FIG. 5(a)), and after the heat deformation (FIG. 5(b)) for the example according to the state of the art, and after the heat deformation (FIG. 5(c)) for embodiment 2 (cooling channel provided in the generatrix direction, utilization of molybdenum for the material of the base material) are shown.

As is shown in FIG. 8, for the example according to the state of the art the homogeneity of the intensity distribution of the far-field pattern after the heat deformation deteriorates because of the heat deformation of the collector mirror assembly, while for embodiment 2 of the present invention the change of the homogeneity of the far-field pattern after the heat deformation is small as compared to the example according to the state of the art.

Figure 9:
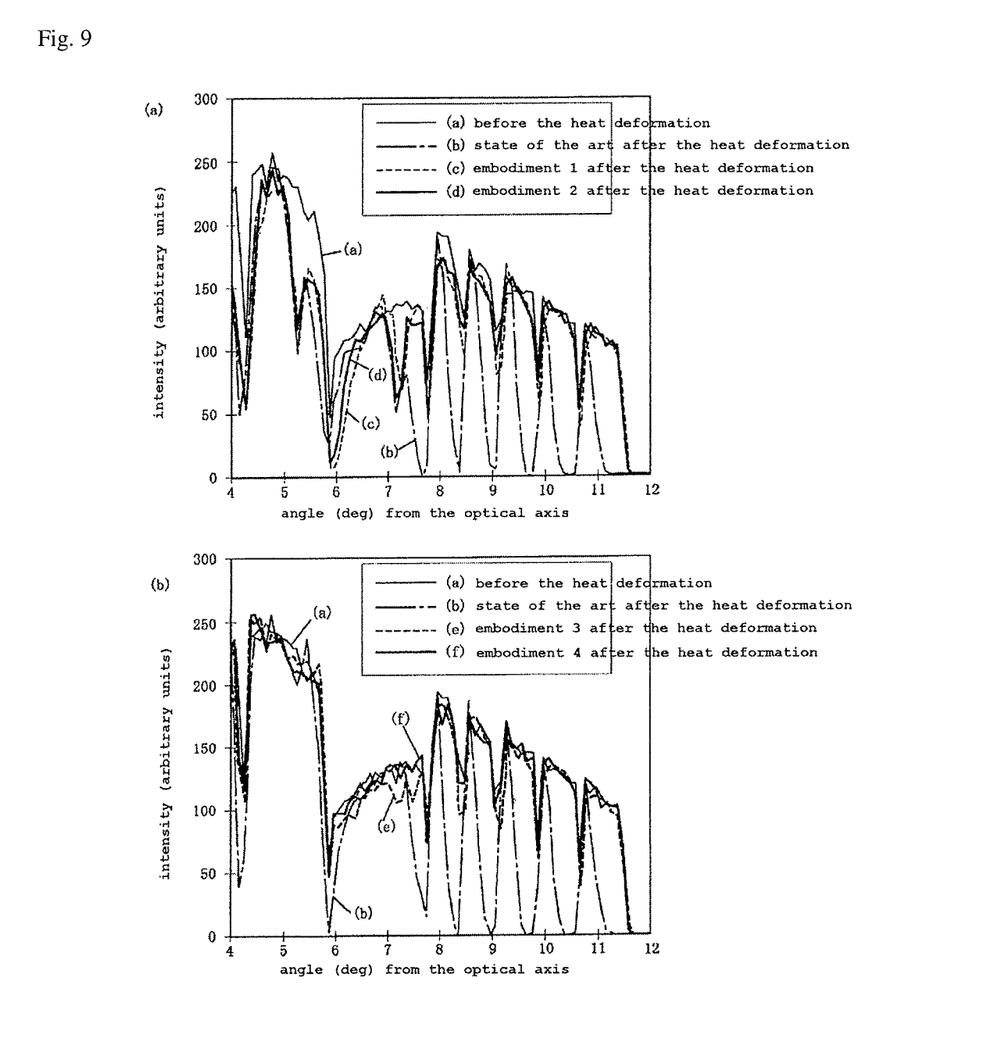
FIG. 9 is a view showing a comparison of the angular distribution characteristics of the light passing the aperture.

FIG. 9 shows a comparison of the angular distribution characteristics of the light passing the aperture. The horizontal axis of this drawing represents the angle (deg) from the optical axis, and the vertical axis represents the radiation intensity (arbitrary units). FIG. 9(a) shows the state before the heat deformation, and after the heat deformation of the example according to the state of the art, and after the heat deformation of the embodiments 1 and 2 of the present invention, and FIG. 9(b) shows the state before the heat deformation, and after the heat deformation of the example according to the state of the art, and after the heat deformation of the embodiments 3 and 4 of the present invention. In the drawing, only the region of an angle of 4 degrees or more from the optical axis is shown.

As is shown in FIG. 9, for the example according to the state of the art there is a plurality of angular regions wherein the intensity becomes 0 because of the heat deformation, while for the embodiments of the present invention the change of the angular distribution characteristics between before and after the heat deformation is small. That is, when a heat deformation of the collector mirror assembly occurs in conjunction with the operation of the light source in a light source device being provided with a collector mirror assembly according to the example of the state of the art, there is a significant deterioration of the angular distribution of the extreme ultraviolet radiation being outputted from the aperture to the exterior, while there is almost no change in a light source device being provided with a collector mirror assembly according to the present invention.

Figure 10:
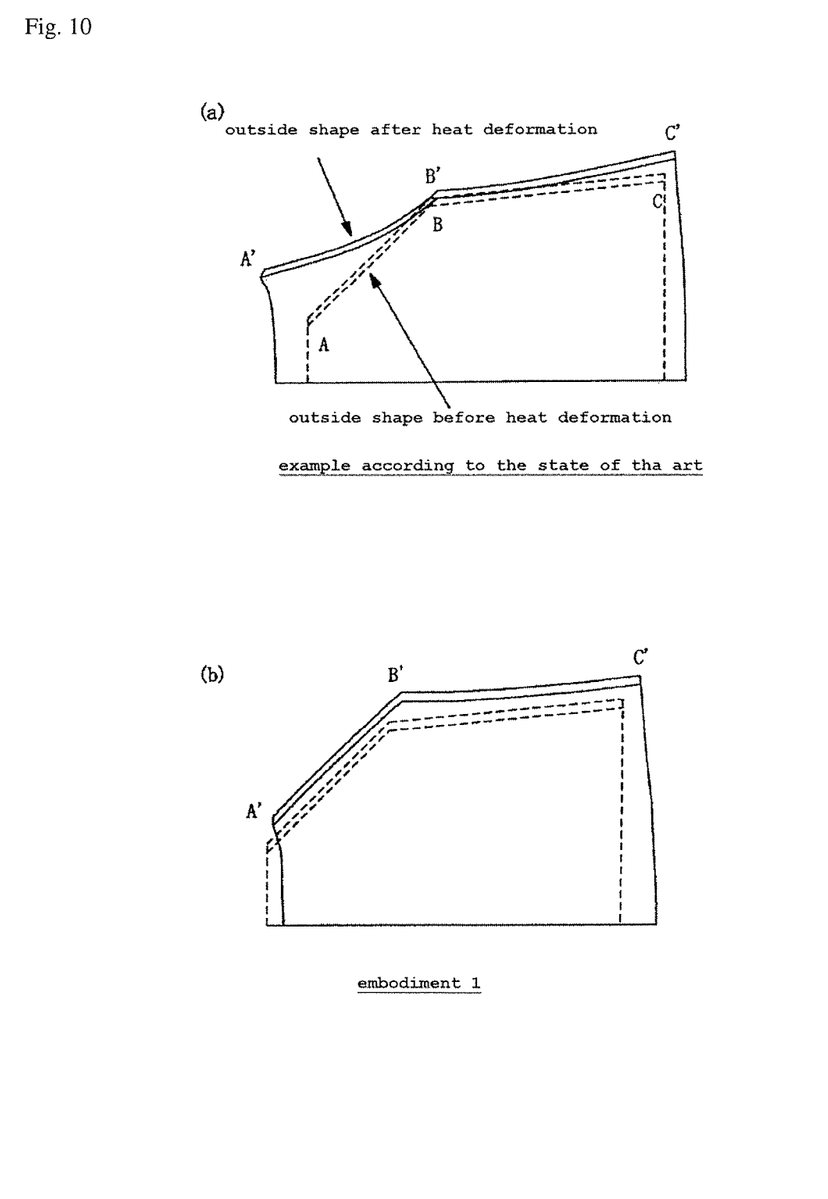
FIG. 10 is a view showing the change in shape of the example according to the state of the art and embodiment 1 before and after the heat deformation.

FIG. 10 shows the deformation of the example according to the state of the art and of embodiment 1 before and after the heat deformation, wherein (a) shows the deformation of the example according to the state of the art before and after the heat deformation and (b) shows the deformation of the reflective shell of embodiment 1 (cooling channel provided in the generatrix direction) before and after the heat deformation. In this drawing, the deformation is illustrated with a rate of magnification of 500, the contour line before the heat deformation is shown by a dotted line and the contour line after the heat deformation is shown by a solid line.

When the state of the deformation of the example according to the state of the art and of embodiment 1 in FIG. 10 are compared, the cross-sectional shape A-B before the heat deformation and the cross-sectional shape A'-B' after the heat deformation of the reflective shell differ significantly for the example according to the state of the art. That is, the amount of the deformation bulging to the outside becomes larger with the approach to the end of the reflective shell and a shape with a reversed curving occurs. The same applies for B'-C'. In embodiment 1, on the other hand, the whole reflecting shell expands in the radial direction because of the heat deformation, but the cross-sectional shape A'-B' after the deformation is almost similar to the cross-sectional shape A-B before the heat deformation. Also the amount of the deformation of B'-C' is smaller than in the example according to the state of the art.

Conceivably, this is because the cooling channel provided along the generatrix direction of the reflective shell acts as a reinforcement suppressing a deformation in the perpendicular direction.

Because the propagation direction after the reflection of light having been radiated into the reflective shell is determined by the reflective surface and the angle of the shell, the collector performance deteriorates as a matter of course when the shape of the reflective surface changes and the incidence angle of light into the reflective surface deviates from the design. Therefore, embodiment 1 suppresses the deterioration of the collector performance because of the heat deformation more than the example according to the state of the art.

When comparing the state of the deformation between the example according to the state of the art and embodiment 2 (cooling channel provided in the generatrix direction, utilization of molybdenum for the material of the base material), although a corresponding illustration is not provided in the drawing, the similarity of the cross-sectional shape before and after the heat deformation is rather corrupted, but the amount of the deformation is smaller than in the example according to the state of the art and a decrease of the collector performance because of the heat deformation can be suppressed more than in the example according to the state of the art for the same reason as above.

The reason for the deformation amount of embodiment 2 being smaller than that of the example according to the state of the art is based on the differences in the physical properties of the reflective shell base material.

Concretely, the thermal expansion coefficient at a temperature of 300 K of the nickel of the example according to the state of the art amounts to approximately $13.7 \times 10^{-6}$ [1/K], while that of the molybdenum of embodiment 2 is small with approximately $4.8 \times 10^{-6}$ [1/K]. Then, the thermal conductivity at a temperature of 300 K of nickel amounts to approximately 91 [W/(m·K)] while that of molybdenum is large with approximately 138 [W/(m·K)].

If the other conditions such as the shape, the structure or the thermal load are the same, the heat deformation amount becomes smaller with regard to the same temperature when the thermal expansion coefficient is smaller, and the temperature rise per se becomes smaller when the thermal conductivity becomes higher. Moreover, because the thermal conductivity is high, the heat deformation becomes considerably small in case of a utilization for the material of the reflective shell. Aluminium or copper being used for the material of the reflective shell of the example according to the state of the art have a higher thermal conductivity than nickel, but because also the thermal expansion coefficient is high, the heat deformation amount is still large.

Then, the states of the heat deformation of embodiment 1 (cooling channel provided in the generatrix direction) and embodiment 4 (cooling channel provided in the generatrix direction, holding plate cooling channels provided, and utilization of molybdenum for the material of the base material) were compared by means of a simulation.

As the result it was found that because in embodiment 1 a heat deformation occurred because of a temperature rise of the holding plates, the reflective shells which are fixed at one end at the holding plate were displaced in conjunction with the deformation of the holding plate, the positional relation between each reflective shell and the collecting point deviated from the state of the design, that is, from the ideal condition, and a deterioration of the collector performance was induced.

Because, in contrast, in embodiment 4 the holding plates are cooled, the temperature rise of the holding plates during the operation of the light source is small, and because of the lesser deformation of the holding plates than in embodiment 1 wherein the holding plates are not cooled, a decrease of the collector performance is suppressed.

Thus, by using the collector mirror assembly of the present invention it becomes possible to obtain a stable power of the extreme ultraviolet radiation and stable angular distribution characteristics throughout the operation of the light source.

DESCRIPTION OF REFERENCE NUMERALS 1 chamber
1c partition wall
2 EUV collector mirror
3 debris trap
7 EUV extraction part (aperture)
11, 12 electrode
14 high temperature plasma raw material
15 container
16a, 16b rotation motor
17 laser light
17a laser source
20 collector mirror assembly 21 reflective shell
22 holding structure
22a holding plate
22b outer holding structure
22c inner holding structure
23 cooling channel
23a cooling water entrance
23b cooling water exit
24 holding plate cooling channel
C optical axis
P plasma

The invention claimed is:

1. A collector mirror assembly comprising
a plurality of grazing incidence reflective shells with different diameters which are shaped as ellipsoids of revolution or hyperboloids of revolution and each of which surrounds a rotational central axis such that the positions of collecting points of said shells approximately coincide, and
a reflective shell holding structure holding said plurality of reflective shells,
wherein:
a cooling channel through which a cooling medium cooling the reflective shell passes is formed on each reflective shell on a rear outer face surface of each shell along a generatrix direction of the reflective shell which direction is defined for grazing incidence reflective shells and runs on the surface of the reflective shell along the direction of said rotational central axis, the cooling channel thus reinforcing the reflective shell and suppressing heat distortion of the reflective shell in the generatrix direction and in a perpendicular direction,
the reflective shells are elements for which a surface of a base material is provided with a reflective layer that reflects extreme ultraviolet radiation, and
molybdenum is employed as the material for the base material.

2. A collector mirror assembly according to claim 1, characterized in that
cooling channels through which a cooling medium cooling said holding structure passes are formed in the reflective shell holding structure.

3. An extreme ultraviolet light source device comprising:
a discharge part comprising a pair of discharge electrodes heating and exciting an extreme ultraviolet radiation seed and generating a high temperature plasma,
a collector means collecting extreme ultraviolet radiation emitted from the high temperature plasma having been generated in the discharge part, and
a light extraction part which outputs the collected extreme ultraviolet radiation, characterized in that
said collector means is a collector mirror assembly, comprising:
a plurality of grazing incidence reflective shells with different diameters which are shaped as ellipsoids of revolution or hyperboloids of revolution and each of which surrounds a rotational central axis such that the positions of collecting points of said shells approximately coincide, the reflective shells being elements for which a surface of a base material of molybdenum that is provided with a reflective layer that reflects extreme ultraviolet radiation, and
a reflective shell holding structure holding said plurality of reflective shells,
a cooling channel through which a cooling medium cooling the reflective shells passes that is formed on each reflective shell on a rear outer face surface of each shell along a generatrix direction of the reflective shell which direction is defined for grazing incidence reflective shells and runs on the surface of the reflective shell along the direction of said rotational central axis, the cooling channel thus reinforcing the reflective shell and suppressing heat distortion of the reflective shell in the generatrix direction and in the perpendicular direction.

* * * * *